United States Patent [19]
Wunner

[11] 3,986,046
[45] Oct. 12, 1976

[54] DUAL TWO-PHASE CLOCK SYSTEM

[75] Inventor: John J. Wunner, Sayville, N.Y.

[73] Assignee: General Instrument Corporation, Clifton, N.J.

[22] Filed: Mar. 11, 1974

[21] Appl. No.: 449,939

Related U.S. Application Data

[63] Continuation of Ser. No. 274,308, July 24, 1972, abandoned.

[52] U.S. Cl. .......................... 307/208; 307/221 C; 307/263; 307/269; 307/293
[51] Int. Cl.² ................... H03K 5/15; H03K 5/153; H03K 23/22; G11C 19/20
[58] Field of Search ........ 307/221 R, 221 C, 224 R, 307/224 C, 220 R, 220 C, 205, 208, 214, 262, 269, 293, 263

[56] References Cited
UNITED STATES PATENTS

| | | |
|---|---|---|
| 3,564,299 | 2/1971 | Varadi et al. ...................... 307/269 |
| 3,641,370 | 2/1972 | Heimbigner .................... 307/205 X |
| 3,735,277 | 5/1973 | Wanlass ........................... 307/251 X |
| 3,745,472 | 7/1973 | Garth ............................. 307/269 X |

FOREIGN PATENTS OR APPLICATIONS

| | | |
|---|---|---|
| 862,284 | 1/1971 | Canada .............................. 307/205 |

*Primary Examiner*—John S. Heyman
*Assistant Examiner*—L. N. Anagnos

[57] ABSTRACT

A new and improved clock system is described which is effective to substantially increase speed of operation of logic circuits without the need for additional power. That system includes the use of two sets of like phased clock signals, one of which is applied to the internal circuitry and the other of which controls the input and output stages of the circuit. By apportioning the capacitive load on the clock generator, the slower switching input and output circuitry is provided with faster switching clock signals exhibiting increased usable clock time while the faster switching internal circuitry is provided with less usable clock time. As a result, the available clock power is used to maximum efficiency and circuit speed is increased to the limit of the switching capabilities of the internal circuitry.

24 Claims, 5 Drawing Figures

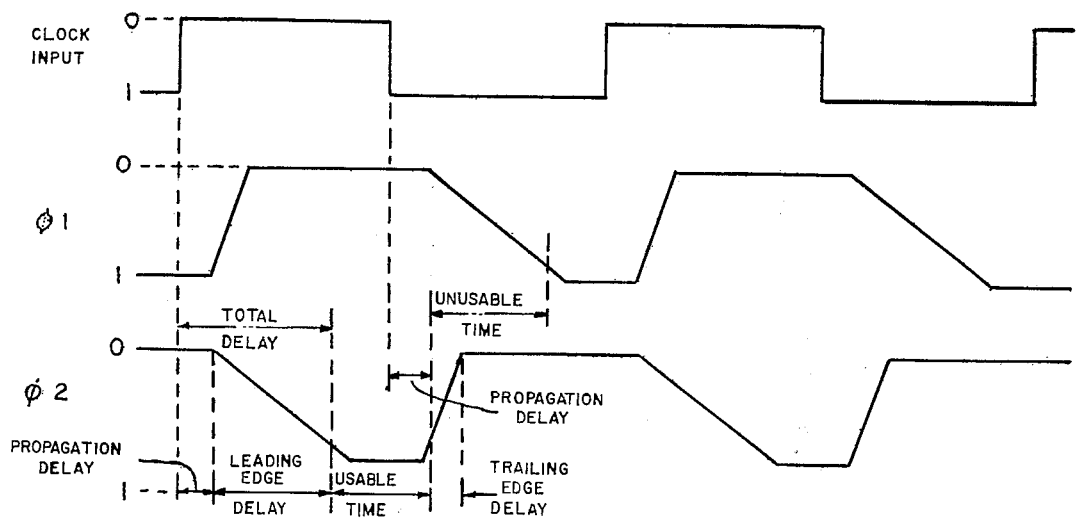
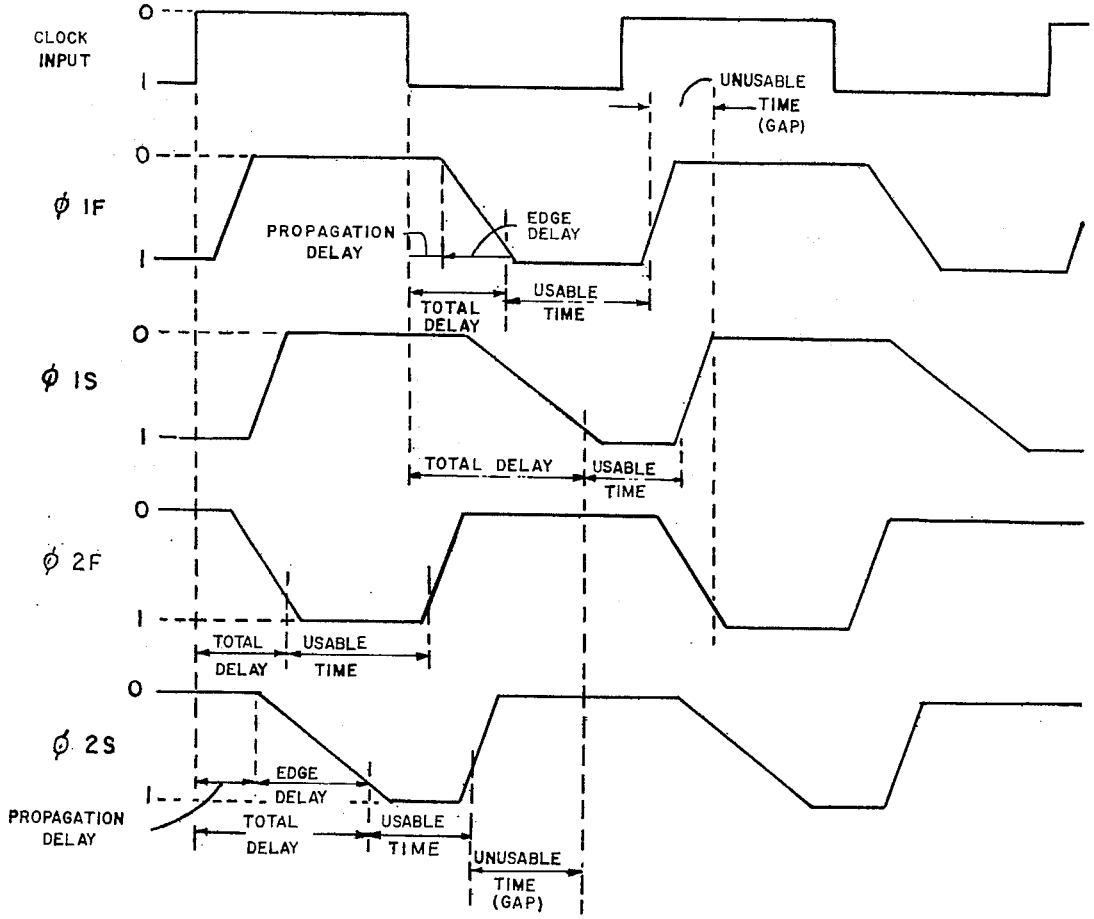

DUAL TWO-PHASE CLOCK SYSTEM

This is a continuation of application Ser. No. 274,308, filed July 24, 1972, entitled DUAL TWO PHASE CLOCK SYSTEM, and now abandoned.

This invention relates to logic circuits and more particularly to the use in such circuits of a dual two-phase clock system and to circuitry for generating same.

Logic circuits of the type described are basic building blocks of digital data processing systems. In digital circuits of this type, data is typically stored at one or more nodes in the form of a binary data signal at one of two discrete logic conditions. These circuits are designed to perform logical operations upon incoming data and to provide output data signals governed by such operations. Examples of the various specific applications of such circuitry are shift registers, counters, adders and various gating circuits for performing arithmetic operations.

In the operation of a typical synchronous logic circuit, the various logic operations are performed under the control of timed clock signals which serve to sequence the operation of the various logic blocks of a digital system or network. Many circuits are known which generate such clock signals at the desired high frequencies and accuracy. One of the major problems involved in generating effective clock signals internally on a semiconductor chip is what may be generically termed clock generation delay. This delay may be conveniently divided into two components —(1) clock propagation delay, the delay inherent in the clock generator circuitry itself in commencing and terminating the output signal after the input clock has switched, and (2) edge delay, the delay once the output has commenced switching in reaching an effective logic level to which it is switched. The former necessitates the use of set up and hold circuits at the chip interface, while the latter severely limits the usable clock time for switching functions.

Edge delay is directly related to the power used to generate the clock signals and the capacitive load to be driven thereby. Thus, the amount of circuitry which may be driven by a given set of internally generated clocks is limited—since, for increased capacitive load, the negative clock edge is increased, eventually to the limit of usable clock time. For example, in a typical two-phase MOS (metal oxide silicon) shift register, the operative circuit nodes of each stage are adapted to be unconditionally charged negative through a load device, comprising a MOSFET having a high "on" resistance. The data is conditionally discharged through a high speed clocked switching MOSFET. Accordingly, the capacitive load on the clock generator comprises the sum of the gate capacitances of the switching devices in each stage. The larger the circuit (i.e. the longer the shift register) the higher the capacitive load, and, for a given clock generator, the larger the edge delay (rise time) and the smaller the resulting usable clock time.

Propagation delay is inherent in the clock generator itself and creates a timing problem at the chip interface. For example, unless the input data is delayed by at least as much as the delay inherent in the clock generator, inputs will still be sampled after they have switched. The use of circuitry for providing this data delay not only increases the size and expense of the circuit, but also limits the speed of operation.

The most direct solution to these problems is to increase the power in the clock generator. However, for the typical high speed and high density integrated logic circuit this solution has been found unsatisfactory both in terms of excessive cost and heat dissipation.

MOS devices of the type referred to above are today widely used in the design of large scale integrated logic circuitry as a result of their high speed, relatively low power dissipation and the ability of MOS technology to integrate more functions on a chip and to give consistently higher processing yields than today's bipolar technology. Yet there are still many areas, particularly in high performance systems, where bipolar devices are considerably more effective and combinations of MOS and bipolar circuits have been found to offer improved performance by utilizing the outstanding features of each type of device.

The problems of propagation and edge delay present one of the major obstacles to the successful combination of clocked logic circuits of different types, such as MOS and bipolar circuits. These delays become particularly excessive when interfacing logic circuits of different types. Thus, for example, when a clocked MOS logic circuit, such as a shift register, is interfaced with a TTL (transistor-transistor logic) circuit, the resulting large delay at the interface substantially limits the speed and efficiency of the circuit performance. This large delay arises primarily as a result of the difference in voltage swings upon which these two types of circuits are designed to be operated (typically 17 volts for MOS as opposed to 5 volts for TTL) and the difficulties in generating high level MOS clocks from a low level TTL clock input. Thus, it has been found necessary to provide special buffer circuits to convert the low level TTL data to acceptable high level MOS data signals (or vice versa) at the chip interface. Such circuits are of necessity much slower than the MOS logic gates internally of the chip and thus severely limit the permissible edge delay of the internally generated clocks (which detracts from usable clock time). Moreover, large propagation delays encountered in the generation of high level MOS clock signals from a low level TTL input results in the requirement for large set up and hold times, further contributing to delay at the interface and limiting the performance of the circuit It is a primary object of the present invention to design internally clocked semiconductor logic circuits adapted to operate at high speeds at power levels lower than those heretofore used.

It is another object of the present invention to provide semiconductor logic circuits of the type described in which the delays in signal transmission at the chip interface are minimized, thereby increasing speed of operation without the need for increasing power.

It is yet another object of the present invention to provide a dual two-phase clock system designed to provide synchronous operation of semiconductor logic circuits by minimizing the capacitive load on the clocks driving the input and output stages of the circuit, thereby to minimize propagation delay at the chip interface.

It is still another object of the present invention to provide a new and improved clock system for semiconductor logic circuits using synchronous "fast " and "slow" two-phase clock signals to account for the differences in switching speed between the input and output gates at the chip interface as compared to the internal circuitry, whereby speed of operation is increased to the switching capacity of the internal circuitry.

It is a further object of the present invention to provide a dual two-phase clock generator adapted to provide two pairs of high level synchronized clocks from a single low level clock input, one of which is used to drive the relatively low capacitance input and output stages with a minimum of edge delay and a maximum usable clock time and the other of which is adapted to drive the internal circuitry with somewhat less usable clock time.

It is yet another object of the present invention to provide a novel and improved dual two-phase clock system designed to minimize propagation and edge delay and to maximize usable clock time at the interface of logic circuits of different types.

It is still another object of the present invention to provide an internal clock generator for use in semiconductor integrated circuits which reduces substantially propagation delay without increasing power requirements.

To these and other objects, the present invention is designed to maximize speed of operation of interfaced logic circuits by providing a new and inproved clock system effective to utilize the available clock power with maximum effectiveness. The present invention is based upon the fact that in high speed logic circuits of the type described, the internal stages may be designed to operate much faster than the input/output interfaces would allow with a standard internal clock generator. The delays at the interfaces are minimized in accordance with the present invention without the need for increasing the power of the clock generator, by the use of two pairs of clocks rather than only one pair. The bulk of the capacitive circuit load (the internal circuitry) is driven by one pair of clocks and the input and output circuitry is driven by the other pair. Since the total load on the clocks used to drive the input and output circuitry is relatively small compared to the internal circuit load of a typical logic circuit, these interface clock signals exhibit substantially reduced edge delays, thereby to provide a maximum usable clock time for the relatively slow input/output circuitry. Moreover, because of the relatively small capacitive load, these clocks may be generated by circuitry using smaller devices resulting in reduced propagation delays.

By contrast, the other pair of clocks exhibit much larger propagation and edge delays and shorter usable clock times. However, clock propagation delay is only a factor at the interfaces and because the internal circuitry is designed to operate at much faster switching speeds, the shorter usable clock times do not limit speed of operation. As a result, delays in signal transmission at the interfaces are minimized, thereby considerably enchancing circuit performance and minimizing the required circuitry for set up and hold time. Moreover, this is accomplished without the need for any increase in clock power since the clock power in accordance with the system here described is used to maximum efficiency, i.e. the internal circuitry is provided with only so much usable clock time as is necessary to accomplish effective switching.

To the accomplishment of the above and to such other objects as may hereinafter appear, the present invention relates to a dual two-phase clock system as defined in the appended claims and as described herein in connection with the accompanying drawings, in which:

FIG. 2 is a graphical illustration or timing diagram showing the relationship of the two-phase output clock signals with the input clock signal for a standard internal clock generator of the prior art;

FIG. 4 is a timing diagram similar to FIG. 2 but showing the input clock signal and the two pairs of two-phase output clock signals from the clock generator of FIG. 3.

The dual two-phase clock system described herein is applicable to integrated logic circuits of all types in which clocked data must be transmitted through circuits comprising stages having different speeds of operation. However, since as noted above the problems of edge and propagation delay are most severe in connection with the transmission of data at the interface of a semiconductor chip and particularly where high level clock signals must be generated from a low level input clock, the present invention is here described specifically in connection with such interfacing and in one embodiment as applied to the operation of synchronous MOS logic circuits interfaced with TTL logic chips. It will be readily understood, however, that the specific embodiments herein described and illustrated are merely exemplary of the many situations in which my novel and improved dual two-phase clock generating system is equally applicable.

Throughout this specification the standard MOS negative logic system wherein logic "1" indicates more negative while logic "0" indicates more positive will be utilized, notwithstanding that TTL circuitry normally utilizes the opposite positive logic.

Figure 1:
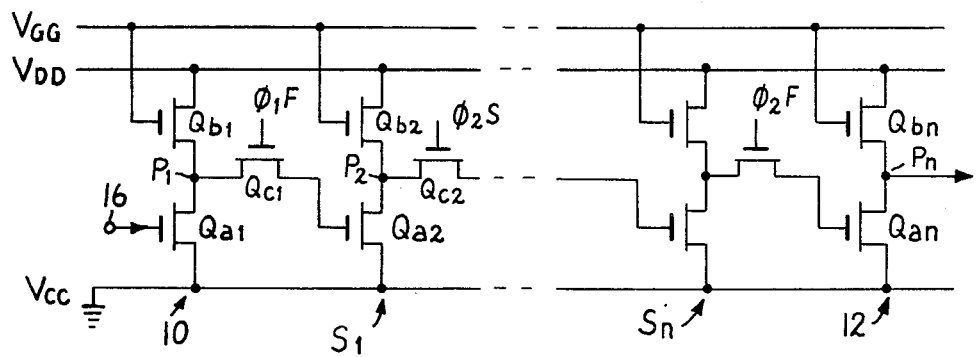
FIG. 1 is a circuit diagram of a simplified shift register adapted to use the dual two-phase clock system of the present invention.

Referring now to the drawings and specifically to FIG 1, there is shown an exemplary embodiment of a standard MOS shift register circuit integrated on a chip of semiconductor material and adapted to be interfaced at either end of the register with additional circuitry. (The circuit of FIG. 1 has been simplified to its bare essentials for convenience.) As there shown that circuit comprises an input stage generally designated 10, an output stage generally designated 12 and a plurality of internal register stages S (here only partially shown) typically running into the hundreds.

Each stage, including the input and output stages 10 and 12, comprises a simple inverter circuit with a pair of switching devices here designated FETs $Q_a$ and $Q_b$ having their output circuits operatively connected in series between the $V_{DD}$ and $V_{CC}$ voltage supply levels. The gate terminal of the upper device is operatively connected to the $V_{GG}$ supply voltage, thereby to bias that device to its "on" condition. Accordingly, when the lower device FET $Q_a$ is rendered nonconductive, the junction node $p$ between the two devices is charged to the $V_{DD}$ supply level. Conversely, the resistance of FET $Q_b$ is made sufficiently higher than that of FET $Q_a$ so that when FET $Q_a$ is rendered conductive the junction node $p$ is drawn close to the $V_{CC}$ supply level.

Typically $V_{DD}$ is sufficiently more negative than $V_{CC}$ to provide a gate bias to the lower device of subsequent stages while the $V_{GG}$ supply is sufficiently more negative than the $V_{DD}$ supply to maintain the upper devices FETs $Q_b$ biased into conduction. For convenience $V_{CC}$ will hereinafter be considered at ground and provides a reference for the negative supply voltages $V_{DD}$ and $v_{GG}$. With $V_{CC}$ at ground, typical values for $V_{DD}$ and $V_{GG}$ are −12 volts and −24 volts, respectively. (Considerably lower values are possible with controlled low threshold devices.)

The data is fed at the input terminal 16 to the gate of FET Qa1 of the input stage 10 of the register and appears at node p1 in the inverted logic condition. The thus inverted data is transferred to the gate terminal of $Q_{a2}$ of the next stage S1 of the register by means of a clocked switching FET $Q_{c1}$ and so on until the data appears at the output terminal $p_n$ where it is transmitted across the chip interface to subsequent circuits within the network.

In a typical two-phase shift register system the switching FETs $Q_c$ are alternately clocked at their gate terminals by two non-overlapping clock signals 01 and 02. Thus for example, the data at node p1 of stage 10 is transferred via FET $Q_{c1}$ to the input gate of FET $Q_{a2}$ of the subsequent stage S1 during 01 time, inverted by that stage and transferred from node p2 to the input gate of the subsequent stage via FET $Q_{c2}$ during 02 time whereupon the data is again inverted and transferred to the next stage during 01 time and so on from stage to stage until the data reaches the output. It will be apparent that the data is transferred through one bit of the shift register (two inverter stages) during each full clock cycle (01 and 02) so that, for example, the data appears at the output of a 200-bit shift register after 200 full clock cycles from the time it enters the circuit.

For reasons that will hereinafter become apparent, the first and last stages 10 and 12 of the register are of necessity considerably slower in switching speed than the remaining internal stages S. This difference in speed is a function primarily of the characteristics of the input data provided by the circuits with which the register is interfaced and of any special interfacing circuitry utilized. Suffice it to say that the minimum usable clock time which must be supplied by the clock phases 01 and 02 is invariably limited by the speed of operation of the input and output stages. As a result, since the internal shift register stages S are faster switching, some of the usable clock time supplied to FETs $Q_c$ of those stages is simply wasted—that is, the signal is transferred from the output of one stage to the input of the next stage in the first portion of the clock phase, the FET $Q_c$ unnecessarily remaining conductive during the remainder of the clock phase.

A second problem associated with the input and output stages of the register relates to synchronization of the data from chip to chip. Thus, in addition to any propagation delay associated with the interface, the clock signals themselves are delayed further by the internal clock generator on the chip. As a result, the usable clock time does not ordinarily synchronize with the input data. Accordingly, circuitry must be provided for holding the data signal at the input until the sampling clock phase has terminated (until the trailing edge of the clock signal is reached). Moreover, this clock generator propagation delay is added onto the leading edge delay and results in a further delay between the time the data appears at the input and the time when it is gated into the chip.

In order to graphically illustrate these problems, reference is made to FIG. 2 which shows the timing relationship of a pair of non-overlapping clock signals 01 and 02 generated by a standard two-phase clock generator from a typical input clock signal having sharp edges (the clock input is here idealized as a perfect square wave for illustrative purposes). The clocks illustrated in FIG. 2 may be generated by a variety of well known clock generator circuits.

All internally generated clock signals exhibit delay with respect to the timing of the input clock. As illustrated, the total delay associated with such clock signals is made up of two factors—(1) propagation delay; the delay in initiation of the output clock pulse from the edge of the clock input, which is a function of the internal speed of the clock generator, and (2) edge delay; delay in switching of the output signal between its two logic levels, which is primarily a function of the capacitive load driven.

Referring again to FIG. 1, it will be apparent that if the input data configuration is approximately that of the clock input (admittedly an idealization but a reasonable one for the purpose of illustration), that data will not be sampled until it approaches its trailing edge. Moreover, in the absence of additional circuitry, the input data would switch substantially prior to the termination of the operative sampling clock pulse, so that data would continue to be gated into the register after it has switched, an operation which would completely destroy the effectiveness of the register. Accordingly, such additional circuitry is normally provided externally of the chip to "set up" and "hold" input data for the internal clock pulse. While these circuits are designed to synchronize the input data with the internal clocks, they do not at all affect edge delay, which detracts from the usable time of the clock pulse (whether synchronized or not). Moreover, they reduce the possible speed of the circuit by the amount of the propagation delay compensated for. Finally, the larger the propagation delay for which these circuits must compensate the larger and more expensive they are.

The limitation in usable clock time is likewise a problem, since enough usable clock time must be provided to accomplish effective switching from one logic state to another. Since, as noted above, the input and output stages of the circuit are normally slower than the internal circuitry, the minimum usable clock time must be geared to these stages. Stated in other terms, the possible speed of the circuit is limited by the input and output stages and thus the outside circuitry (the remaining circuitry in the network) sees a slower register than the internal circuitry could otherwise provide. (A good analogy in fluid flow is a section of pipe having a constricted input and output.)

Since, conventionally, the same clocks drive all stages, substantially more usable clock time is driven into the register than is actually used, resulting in a substantial waste in power. Moreover, there is a practical limit to the power which may be used to drive the clock generator so that the amount of circuitry to be driven (the length of the register) is unduly limited.

The foregoing problems are largely eliminated in accordance with the present invention by generating two pairs of clock pulses from the input clock instead of one. The first pair, herein designated 01F and 02F, are used to drive the input and output stages of the circuit. While these stages are individually larger than the internal stages, their combined capacitive load is a very minor portion of the total load of the circuit. Accordingly, these clocks exhibit considerably less edge delay and thus more usable clock time than would be the case if they were used to drive the entire circuit. The other pair of clock signals here designated 01S and 02S are used to drive the internal circuitry which constitutes the major portion of the load and thus exhibits more edge delay (i.e. less usable clock time), but here the speed of the circuitry is quite adequate to operate on a minimum of clock drive. Thus, the total clock power is here carefully tailored to the needs of the individual portions of the load circuit and as a result is used to maximum efficiency with a minimum of waste. (The letters "F" and "S" are here used to designate what are referred to as the "fast" and "slow" clocks, respectively. It will be appreciated, however, that the edge delay exhibited by these clocks is a function of the load driven and is not an inherent characteristic of the clock signals themselves).

Figure 3:
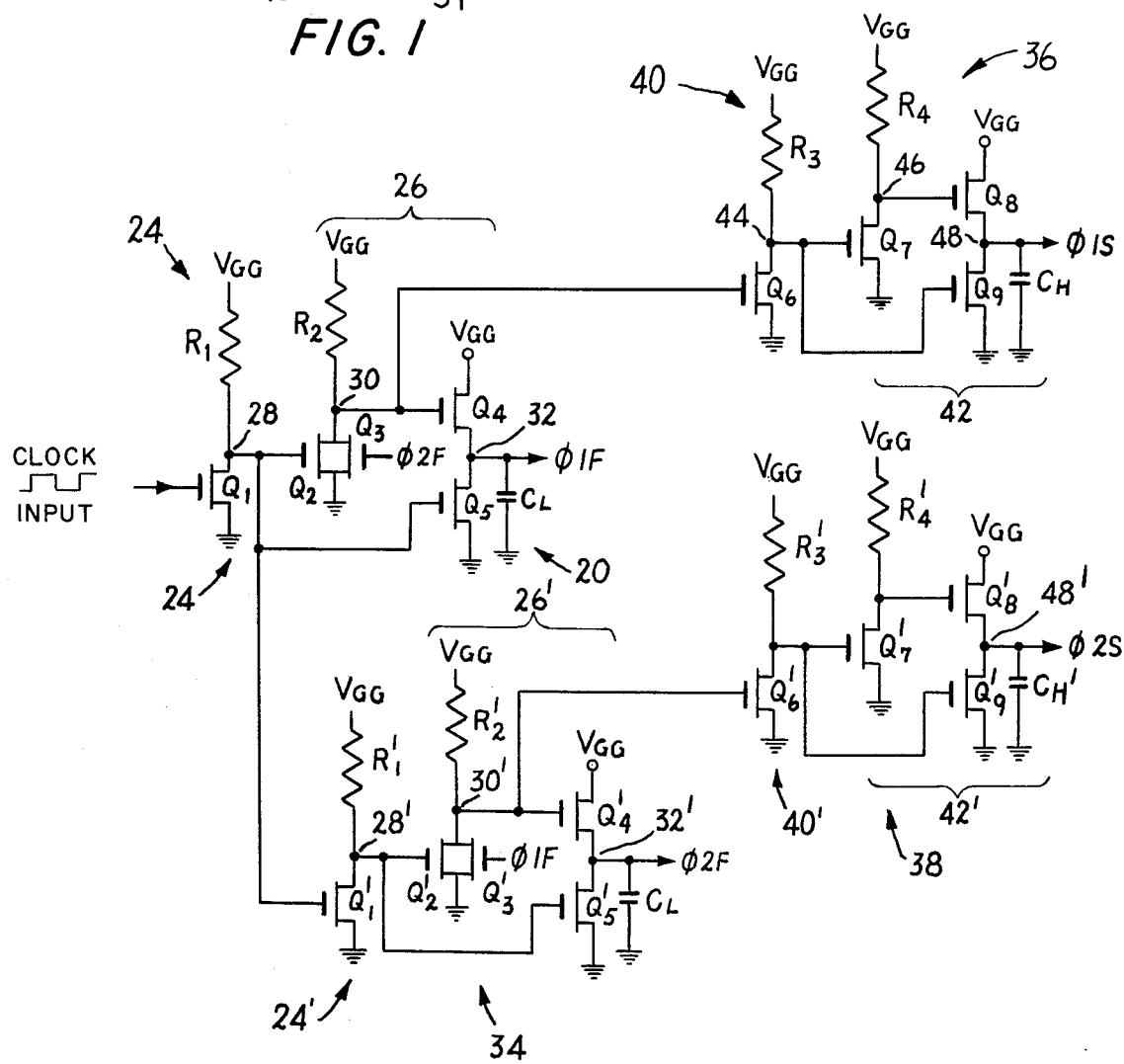
FIG. 3 is a circuit diagram of an exemplary embodiment of a clock generator circuit designed to generate two pairs of two-phase clock signals in accordance with the present invention.

FIG. 3 shows an exemplary embodiment of a dual two-phase clock generator designed to provide two pairs of clocks in accordance with the present invention. As there illustrated, the clock signal 01F is generated by a subcircuit generally designated 20 which comprises an inverter stage 24 and a push-pull amplifier 26 cascaded in series. Inverter stage 24 comprises a resistor R1 connected in series with a FET Q1 between the $V_{GG}$ supply and ground. The input clock signal is applied to the gate of FET Q1 and the inverted output at node 28 is applied to the driver FET Q2 of stage 26. FET Q2 is in turn connected in series with resistor R2 and provides a second inversion at node 30, all in well known manner. An additional FET Q3 is operatively connected in parallel with FET Q2 and is effective to "OR" the inverted output with the complementary 02F clock phase to insure against slight overlaps. The double inverted output at node 30 is applied to the gate terminal of the upper device FET Q4 of the push-pull stage of amplifier 26. The gate of the lower device FET Q5 is returned to the drain of FET Q1 and thus receives the inverted output at node 28. The 01F output signal is taken off output node 32 at the junction between FETs Q4 and Q5 and is used to control the input and output gates of the load circuit, represented by a relatively low capacitive load here illustrated as capacitor $C_L$.

Subcircuit 20 operates as follows: When the clock input signal goes negative (to logic "1") FET Q1 is rendered conductive drawing current through resistor R1, whereby the signal at node 28 is drawn toward ground (logic "0"). The positive going signal at node 28 in turn is effective to turn off FET Q2 and substantially simultaneously the positive going edge of clock phase 02F is effective to turn off FET Q3, thereby charging node 30 through resistor R2 negatively to the logic "1" level. This in turn is effective to bias FET Q4 into conduction and, since FET Q5 is turned off by the logic "0" output at node 28, the output clock signal 01F at node 32 goes negatively (logic "1").

Similarly, as the input clock goes positively (to logic "0"), node 28 goes negatively thereby to draw node 30 toward ground, cutting off FET Q4, whereby the output signal at node 32 is discharged to ground via conductive FET Q5. Accordingly, as illustrated in FIG. 3, the 01F clock phase represents the "true" of the input clock square wave. Moreover, as a result of the very small total capacitive load $C_L$ to which this signal is applied, the output exhibits considerably sharper leading and trailing edges (less edge delay) than a standard clock signal generated with the same power, thereby substantially increasing the available usable clock time (the time during which 01F is at its effective logic "1" signal level). In addition, because the capacitive load is small, the subcircuit 20 may be designed to be considerably smaller and faster than is ordinarily the case, thereby also reducing propagation delay through the circuit. As a result, the total delay in gating at the inputs and outputs is minimized and the usable clock time is maximized without the need for additional power.

The complementary clock phase 02F for use in controlling input and output gating is generated by subcircuit 34 which is identical to subcircuit 20 (the elements thereof being designated with like reference numerals with the addition of a prime) with the exception that it receives at its input, the inversion of the externally supplied clock input generated at node 28. Accordingly, as a result of this additional inversion, the 02F output represents the complement of the 01F signal.

The pair of slow clocks 01S and 02S are generated respectively by identical subcircuits 36 and 38 which are substantially identical in operation to subcircuits 26 and 34. Subcircuit 36 comprises an inverter stage 40 operatively connected in cascade with a push-pull amplifier stage 42. Inverter stage 40 comprises FET Q6 connected in series with resistor R3 between the $V_{GG}$ supply and ground. Push-pull amplifier 42 comprises FET Q7 connected in series with resistor R4 between the $V_{GG}$ supply and ground and FETs Q8 and Q9 operatively connected in series between the $V_{GG}$ supply and ground. The gate terminals of FETs Q7 and Q9 are operatively connected to node 44 at the output of inverter stage 40 while the gate of FET Q8 is operatively connected to node 46 at the junction between resistor R4 and FET Q7. The input to subcircuit 36 at the gate terminal of FET Q6 is operatively connected to node 30 of subcircuit 20. Accordingly, the gate of FET Q6 receives the twice inverted clock input signal at node 30 of subcircuit 20, is inverted by inverter stage 40 at node 44, amplified by push-pull amplifier 42 and appears at output node 48 as the 01S clock signal (see FIG. 4).

Subcircuit 38 is identical to subcircuit 36 with the exception that its input terminal is operatively connected to node 30' of subcircuit 34 and thus receives the thrice inverted clock input signal at the gate of FET Q6'. Accordingly, the 02S output at node 48' represents the complement of the 01S signal. The capacitor $C_h$ in both subcircuits 36 and 38 represent the relatively high capacitive load of the internal circuitry to which the 01S and 02S clock signals are applied. As best shown in FIG. 4, this relatively large capacitive load results in significantly larger propagation and edge delays associated with the 01S and 02S signals and accordingly less usable clock time. However, since the internal circuitry is relatively fast switching, the relatively short usable clock time provided by these signals is quite sufficient for effective circuit operation.

It will be noted that as a result of the relatively large edge and propagation delays associated with the 01S and 02S signals the additional FET corresponding to FETs Q3 and Q3' in subcircuits 20 and 34 are rendered unnecessary in subcircuits 36 and 38 since the increased delays result in a relatively large gap between the usable clock times associated with these signals thereby to insure against overlap (see FIG. 4).

It will be noted that the generation of the slow clock signals 01S and 02S in accordance with the circuit of FIG. 3 requires two additional stages more than that used to generate their fast counterparts. As a result, the slow clocks in addition to exhibiting a greater edge delay as described above will also include a slightly greater propagation delay as a result of the clock generator circuitry itself. Again, however, this additional delay in clock pulse initiation does not detract at all from the overall speed of the circuit as seen from externally of the semiconductor chip—the data is gated into and out of the circuit by the fast clocks 01F and 02F which exhibit a minimum of edge and propagation delay. Moreover, any additional propagation delay in generating the 02 clock phase (both 02S and 02F) resulting from the additional inverter stage is compensated for by FETs Q3 and Q3' in subcircuits 20 and 34, which are effective to synchronize the complementary signals at nodes 30 and 30'.

Finally, it will be appreciated that in accordance with the circuit illustrated in FIG. 1, the clock input drives only a single gate (that of FET Q1). As a result, the capacitive load on the external clock generator is minimized and the wave form of the clock input is preseved to a maximum extent.

While the circuit of FIG. 3 is particularly effective for generating dual two-phase clock signals for use as described herein, that circuit is merely exemplary and various other circuits will be apparent to those skilled in the art. Moreover, it will be appreciated that comparable circuitry may be provided for generating dual sets of clock signals having three, four or more phases as the particular application requires, all such modifications being well within the skill of the art. Finally, the use of dual sets of clock signals for distributing the capacitive load on the clock generator in the manner described herein is an extremely versatile technique and is applicable to a wide variety of clocked circuits, that of FIG. 1 being a very rudimentary example purely for illustrative purposes.

The versatility and additional advantages of the present invention will now be specifically described in connection with the somewhat more practical logic circuit of FIG. 5. As there shown, that circuit comprises a shift register system utilizing two register systems 50 and 52 operatively connected in parallel. Registers 50 and 52 are typically identical and accordingly only register 50 is illustrated and described in detail.

That shift register circuit comprises a data input circuit 54 operatively connected to a data input node 56 at which the input data signal, preferably from a TTL circuit 65, is applied, a write input circuit 58 operatively connnected to a write input node 60 at which the write input signal, preferably from a TTL circuit 63, is applied, a data recirculate circuit generally designated 62 operatively connected to a node 64 to which the output data is fed back, and the internal register circuit generally designated 66 operatively connected between the data input node 56 and a register output node 68. The output nodes of both registers 50 and 52 are operatively connected to an output circuit generally designated 70 adapted to provide multiplexing of the data appearing at both register outputs, thereby to provide a common output signal at the system output node 72.

This type of register system, which is commonly known as a multiplex shift register, is particularly effective in increasing the rate of data transfer to substantially twice the rate of the system clock. Thus, for example, in a two-phase clock system as shown herein the two phases of the clock period are applied in reverse order to the two shift registers. The first register samples the data input during the first clock signal and the second register samples the data during the second clock signal. As a result, the data is sampled twice during each clock period and the system operates substantially at twice the frequency of the system clock—the data switches twice during each clock period. As each of the registers is shifted during the opposite clock signals, the data in each register is shifted along successive register stages to the output node of that register, the data signal at the two register output nodes being representative of the two portions of the data signal respectively sampled at the input stages of each register. The register outputs are then combined by the output circuit 70 which is effective to alternately sample them during the same clock signals which cause their respective registers to sample, thereby to reconstitute the data at system output node 72.

Register systems of this type provide reduced power dissipation for a given rate of data transfer, since the effective clock frequency is essentially half that of the data transfer rate. Stated in other terms, theoretically for a given power the system increases the rate at which data can be shifted by a factor of 2. It will be appreciated, however, that this theoretical increase in data transfer rate is accomplished by substantially doubling the capacitive load on the clock generator and thus the theoretical advantages (doubling the rate of data transfer or conversely halving the power required for a given rate of data transfer) are far from realized as a result of the increased power required to drive the clock generator.

As described above, the power necessary to drive the clock generator is dependent primarily upon the speed of the slowest data transfer stages of the circuit—that is, the clock generator must have enough power to provide sufficient usable clock time for the slowest switching stages of the circuit. As noted previously, the input and output stages of a circuit of the type shown in FIG. 5 are normally considerably slower than the internal circuitry of the register and thus require considerably more usable clock time for effective logic switching. The problem is particularly severe where, as is typically the case in circuits of the character shown in FIG. 5, the MOS circuit is adapted to be interfaced at the input and/or output with logic circuitry of a different character, i.e. such as TTL circuitry. This is a result primarily of the differences in logic level spread used. Thus, for example, while the nominal spread of TTL circuits is 0 to +5 volts, designers must anticipate a typical worst case spread of 2½ volts as opposed to logic level spreads of up to 12 volts in a typical MOS logic circuit. Accordingly, the input stages adapted to receive TTL data or write input signals must be designed with considerably larger switching devices to provide for increased sensitivity to the relatively low level TTL signals. As a result these stages are considerably slower in providing data transfer to and from the body of the register and when used with a standard clock generator provide a considerable bottleneck at the input and output of the circuit.

Figure 5:
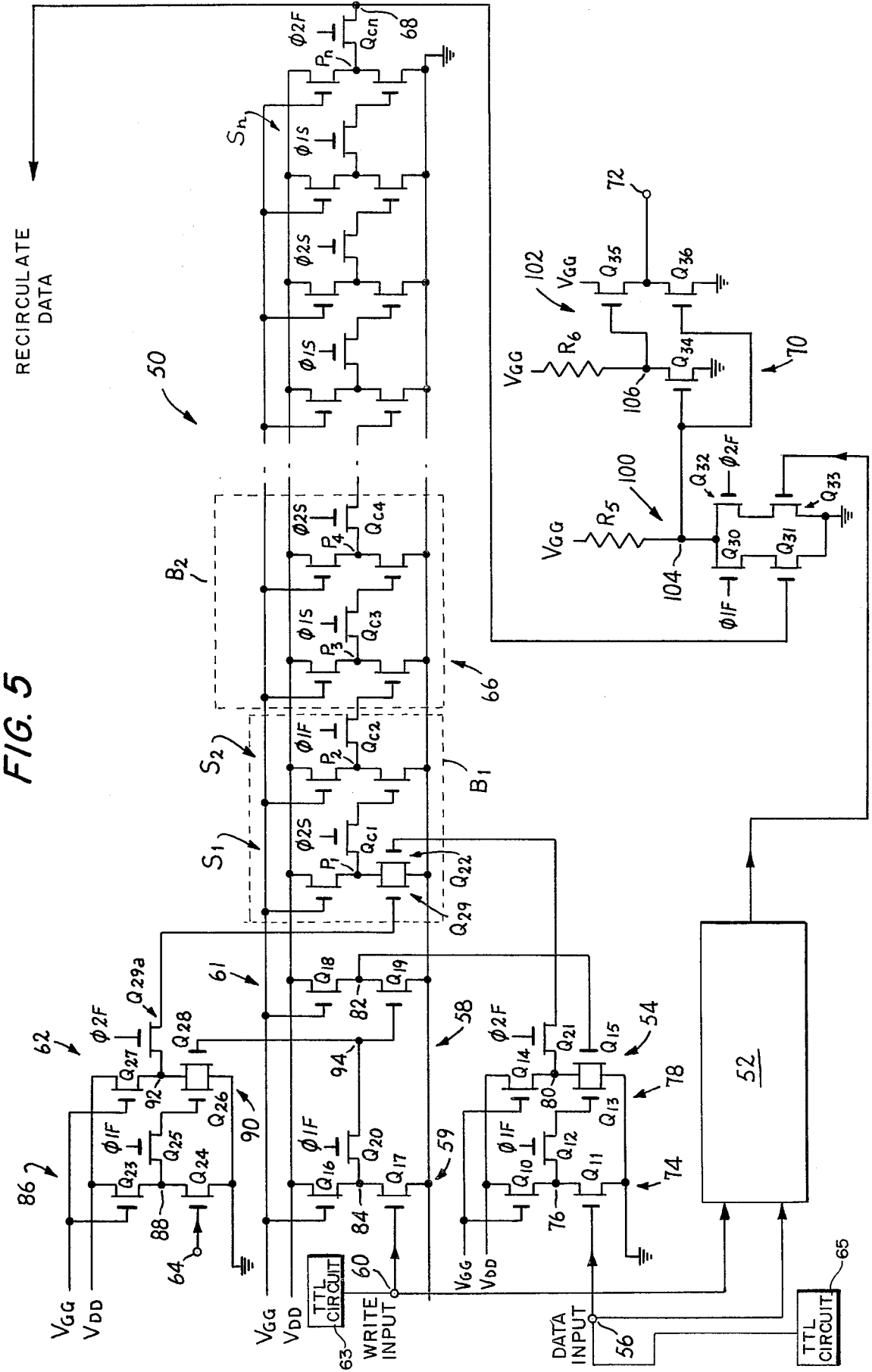
FIG. 5 is a circuit diagram of an illustrative embodiment of an MOS multiplexed shift register to which the clock signals illustrated in FIG. 3 may be applied.

Referring now specifically to the circuit diagram of FIG. 5, it will be seen that the internal register circuitry 50 is identical to that shown in FIG. 1 and accordingly will not be again described in detail. Suffice it to say that that circuit comprises a series of stages S and is effective to shift data signals through each stage S from one node p to the next under the control of the alternate clock signals 01S and 02S. Two such stages S controlled by alternate clock phases 01S and 02S comprise a single bit B of the register.

The data is gated into the first bit B1 of the register 50 by data input circuit 54 which comprises a first stage 74 comprising FETs Q10 and Q11 operatively connected in series between the $V_{DD}$ supply and ground. The gate terminal of FET Q10 is operatively connected to the $V_{GG}$ supply which is effective to maintain that FET biased into conduction. The gate of FET Q11 is operatively connected to the data input node 56 which receives the low level TTL data at the chip interface. The inverted output at node 76 is gated by the clocked transfer FET Q12 to the gate terminal of FET Q13 of the next stage 78. That FET in turn is connected in series with load FET Q14 between $V_{DD}$ and ground. An additional switching FET Q15 is operatively connected in parallel with FET Q13 between the output node 80 of stage 78 and ground. That parallel connection defined a NOR gate effective to pass an operative data signal to node 80 only upon a logic "0" output at the output node 82 of write input circuit 58.

That circuit comprises two stages 59 and 61, the first stage 59 comprising load FET Q16 and switching FET Q17 and the second stage 61 comprising load FET Q18 and switching FET Q19. The gate of switching FET Q16 receives the low level WRITE INPUT signal, the inverted output being taken at junction node 84 and transferred to the gate of FET Q19 of the second stage through a clocked transfer FET Q20. Accordingly, when the low level write input signal is positive (logic "0"), which is the operative or "true" signal in TTL, the doubly inverted high level output at node 82 goes positive and FET Q15 is turned off to allow data to be gated to the output node 80 of data input circuit 54. That data is operatively transferred by transfer FET Q21 to the gate terminal of the switching FET Q22 of the first stage of the register 66. That FET is connected in parallel NOR gate configuration with a switching FET Q29 which is adapted to receive the recirculated data from data recirculate circuit 62 when the write input signal is "false" (logic "1" in the negative logic system).

Circuit 62 is a two-stage circuit identical to data input circuit 54, with the exception that here the data output from the first stage is ORed with the inverted write input signal taken off the source of transfer FET Q20 of write input circuit 58. The first stage 86 of circuit 62 comprises a lead FET Q24 and a switching FET Q23 connected in series between the $V_{DD}$ supply and ground. The gate of FET Q24 is connected to the data recirculate node 64 which receives the output signal from output node 68 of register 50. That signal is inverted at juenction node 88 and transferred via a clocked transfer FET Q25 to the gate of a switching FET Q26 in the second stage 90. That FET is in turn connected in series with a load FET Q27 between the $V_{DD}$ supply and ground and in parallel with an additional switching FET Q28 between node 92 and ground. The gate of FET Q28 is operatively connected to node 94 at the source of FET Q20 and thus receives the inverted write input signal from stage 59 of write input circuit 58. The output at node 92 represents the reconstitution of the data applied to input terminal 64 and is transferred by FET Q29a to the gate terminal of switching FET Q29 in the first stage $S_1$ of the first bit $B_1$ of he register 50. It will be noted that circuits 54, 58 and 62 are all controlled by the pair of fast clocks 01F and 02F. Thus, the gates of FETS Q12, Q20 and Q25 at the first stages of these circuits are connected to the 01F signal while the gates of FETs Q21 and Q29a in the second stages of circuits 54 and 62, respectively, are connected to the 02F signal.

In operation, when the write input signal at node 60 is negative (false in TTL), FET Q17 in the first stage 59 of write input circuit 58 is turned on drawing node 84 toward ground. During 01F time the positive going signal at node 84 is transferred by FET Q20 via node 94 to the gate terminal of FET Q19 in the second stage of the write input circuit. That positive going signal is effective to turn off FET Q19 whereby node 82 is charged negatively through FET Q18. That negatively going signal at node 82 in turn is effective to turn on FET Q15 in the second stage 78 of data input ciircuit 54, thereby to draw node 80 positively. Since FET Q15 is connected in parallel with FET Q13, node 80 will be substantially shorted to ground regardless of the polarity of the data input signal at data input node 56 and accordingly during 02F time the positive signal at node 80 is transferred by clocked FET Q21 to the gate terminal of FET Q22 thereby to turn FET Q22 off. As long as the write input signal at node 60 is negative (false), node 80 will remain positive and FET Q22 will remain nonconductive whereby the recirculated data may be gated into the register by FET Q29.

During 02F time the shifted data appears at output terminal 68, is fed back to node 64 at the input to data recirculate circuit 62 and appears in inverted form at node 88. During 01F time that inverted data is transferred through FET Q25 to the gate terminal of FET Q26. Since the gate terminal of FET Q28 is operatively connected to node 94 that FET will be turned off for as long as the write input signal at node 60 remains negative (node 94 receiving the inversion of the write input signal during 01F time). As a result, the inverted signal at node 88 is again inverted at node 92 and transferred by FET Q29a to the gate terminal of FET Q29 during 02F time, whereupon the data is again transferred from stage to stage through the register 50 during the alternate clock signals.

It will be appreciated that as long as the write input signal at node 60 remains negative (false), data will be recirculated through the register 50 and circuit 62.

Upon the appearance of a true (positive) write input signal at node 60, FET Q17 is turned off, whereby node 84 is charged negative through FEt Q16. As a result during 01F time the negative going signal at node 84 is transferred through FET Q20 to the gate terminal of FET Q19, thereby drawing node 82 positively to turn off FET Q15 in data input circuit 54. In addition, the negatively going signal at node 94 is effective to render FET Q28 conductive, thereby to unconditionally draw node 92 to ground. Also during 01 time the inverted data input signal at node 76 in data input circuit 54 is transferred through FET Q12 to the gate of FET Q13. As a result, during 02F time, FET Q29 in bit 1 of the register is turned off by the positive going signal at node 92 transferred through FET Q29a, whereby new data is adapted to be gated into the register through FET Q22. Since FET Q15 is turned off by the positive going signal at node 82 during 01 time, the input data signal appears in twice inverted form at node 80 and during 02F time that signal is transferred through FET Q21 to the gate of the lower device FET Q22 of the first stage $S_1$ of he first bit $B_1$ of the register.

It will be apparent that as long as the write input signal at node 60 is true (positive), stage 90 of data recirculate circuit 62 is effective to block the recirculated data and stage 78 of data input circuit 54 is adapted to continue to gate new input data into the register.

The use of the fast clock signals 01F and 02F to control the two-stage data recirculate circuit 62 insures synchronization of the input signals to the NOR gates defined by FETs Q26 and Q28, Q29 and Q22 and Q13 and Q15. Moreover, the use of fast clocks in circuits 62, 58 and 54, respectively, provides the additional benefit of enabling both new and recirculate data to be gated into the register 50 with substantially no delay. Thus it will be seen that either new input data or recirculated data appears at the first bit $B_1$ of the register 50 approximately one full clock cycle after it appears at the data input node 56 or the data recirculate node 64. However, since the data transfer through the data input circuit 54 or the data recirculate circuit 62 is accomplished under the control of the fast clock signals 01F and 02F, the first stage of the first bit $B_1$ of the register 50 may be adapted to invert and transfer data within the same clock cycle by clocking the transfer FET QC1 with the 02S clock signal. As illustrated in the timing diagram of FIG. 4 this is made possible as a result of the additional propagation delay exhibited by the 01S clock signal. Thus the 01S signal still has some usable clock time after the 01F signal has begun switching positive. Moreover, if the next stage of the register S2 is clocked by the 01F signal, the first stage of the second bit B2 may be clocked by the 01S signal thereby again accomplishing two inversions within one-half of one clock cycle. As a result, at the end of two clock cycles the data has already been transferred to the output of bit 2 of the register thereby recovering the one bit delay which would otherwise be incurred by the two-stage data input or data recirculate circuits 54 and 62, respectively. Indeed, it will be apparent that the use of alternate fast and slow clock signals may continue beyond the second bit B2 of the register but more extensive use of the fast clock signals 01F and 02F will increase the capacitive load involved in generating these signals thereby increasing propagation and edge delay. Accordingly, the fast clocks 01F and 02F are preferably not used for more than a few bits of the register, the bulk of the register being clocked by the slow clocks 01S and 02S.

Register system 52 comprises circuitry identical to that shown and described with respect to register system 50 with the exception that like stages of the circuit are clocked by the opposite polarity clock signals from that used in register system 50. Thus new data at the data input node and recirculate data node 64 are sampled by register system 52 one-half of one clock cycle prior or subsequent to the sampling of that data by register system 50.

The outputs from register systems 50 and 52 are multiplexed by output circuit 70 which is effective to sample those outputs during alternate clock times. That circuit comprises a clocked NOR gate 100 and a pushpull amplifier 102 operatively connected between NOR gate 100 and common output node 72. NOR gate 100 comprises a resistor R5 operatively connected between the $V_{GG}$ supply and node 104. A first pair of FETs Q30 and Q31 are connected in series between node 104 and ground and a second pair of FETs Q32 and Q33 are connected in series with each other and in parallel with FETs Q30 and Q31 between node 104 and ground. The gate terminal of FET Q31 is operatively connected to the output of register system 50 and the gate terminal of FET Q33 is operatively connected to the output of register system 52. FETs Q30 and Q32 are clocked by the 01F and 02F signals, respectively. As a result, during 01F time FET Q30 is rendered conductive and FET Q32 is rendered nonconductive, whereby the data output from register system 50 (at output node 68) is inverted at node 104. conversely, during 02F time, FET Q32 is rendered conductive and FET Q30 is rendered nonconductive, the output of register 52 being inverted at node 104. Accordingly, during each complete clock cycle the data at the output of first one and then the other register system is sampled by NOR gate 100.

The inverted output at node 104 is applied to the gate terminal of a FET Q34 in the inverter stage of push-pull amplifier 102, that FET Q34 being connected in series with a resistor R6 between the $V_{GG}$ supply and ground, whereby the signal is again inverted at node 106 at the junction between resistor R6 and FET Q34. The amplifier stage of the push-pull amplifier 102 comprises FETs Q35 and Q36 connected in series between the $V_{GG}$ supply and ground, FET Q35 having its gate terminal operatively connected to the node 106 and FET Q36 having its gate terminal operatively connected to node 104. Accordingly, the signal at node 106 (which is the reconstitution of the sampled outputs) is amplified and adjusted to the appropriate voltage levels at output node 72 for transmission across the chip interface to an external circuit such as another TTL circuit.

The use of the fast clocks 01F and 02F to clock the NOR gate 100 is effective to reduce delays in transmission of the register outputs to the common output node 72. In addition, the speed of NOR gate 100 is substantially enhanced by making FETs Q31 and Q33 relatively large. This in turn is made possible by clocking the transfer FET $QC_n$ (and the corresponding FET in register system 52) by the fast clock signals 02F and 01F, respectively, thereby to drive the relatively large capacitance at the gates of FETs Q31 and Q33, respectively.

It will be appreciated from the foregoing that the present invention provides an unusual and successful technique for utilizing available clock power to maximum efficiency in driving clocked logic circuits. The use of dual sets of clock signals as described herein is applicable to any logic circuit in which there is a disparity in switching speeds between one or more switching stages. The technique has been found particularly effective in substantially reducing delays at a semiconductor chip interface thereby to increase speed of operation substantially to the limit of the switching speed of the internal circuitry. This technique provides not only for an increase in usable clock time at the slower switching stages of the circuit but also as a result of the apportioning of the capacitive load on the clock generator is effective to substantially reduce propagation delays in the clock signals utilized to gate data into and out of the operative circuit. As a result, the required sample and hold time is reduced and input and output gating speed is increased.

Finally, the fast and slow clocks as herein provided may be utilized in alternate combinations to provide for the accomplishment of two logic functions within a single clock phase thereby to substantially increase speed of data propagation through the circuit.

While only a limited number of embodiments of the present invention have been herein specifically described, it will be apparent that many variations, may be made therein, all within the scope of the invention, as defined in the following claims.

I claim:

1. In a semiconductor circuit comprising a plurality of switching means adapted to be actuated under the control of timed clock signals and when so actuated to transfer signals therethrough, at least one of said switching means having a relatively small capacitance and requiring more usable clock time for transferring signals than others of said switching means having a relatively large capacitance in the aggregate, the improvement comprising means for generating two sets of clock signals, each set comprising a plurality of substantially out-of-phase signals and the corresponding signals of each set respectively being substantially like-phased, and means operatively connecting one of said sets of clock signals to said at least one of said switch means and the other of said sets of clock signals to others of said switching means, whereby the capacitance encountered by the clock signal generating means in clocking said at least one switching means is less than the total capacitance of the others of said plurality of switching means thereby to provide the said at least one switching means with relatively more usable clock time for signal transfer than said plurality of switching means.

2. The circuit of claim 1, wherein said plurality of switching means comprise semiconductor switching devices each having a control terminal and an output circuit, said output circuit rendered conductive in response to signals applied to said control terminal thereby to transfer signals through said output circuit, at least one of said switching devices in each of said switching means clocked.

3. The circuit of claim 2, wherein said switching devices are field effect transistors.

4. The improvement of claim 1, wherein said circuit is a logic circuit and in which said signals transferred by said switching means are data signals.

5. The circuit of claim 4, wherein said plurality of switching means comprise semiconductor switching devices each having a control terminal and an output circuit, said output circuit rendered conductive in response to signals applied to said control terminal thereby to transfer signals through said output circuit, at least one of said switching devices in each of said switching means clocked.

6. The circuit of claim 5, wherein said switching devices are field effect transistors.

7. The circuit of claim 1, wherein the aggregate capacitive load presented to said clock generating means by said at least one switching means is much less than the aggregate capacitive load presented to said clock generating means by said others of said switching means, whereby said one set of clock signals exhibit less delay and more usable clock time than said other set of clock signals.

8. The circuit of claim 7, wherein said plurality of switching means comprise semiconductor switching devices each having a control terminal and an output circuit, said output circuit rendered conductive in response to signals applied to said control terminal thereby to transfer signals through said output circuit, at least one of said switching devices in each of said switching means clocked.

9. The circuit of claim 8, wherein the number of clocked switching devices in said at least one swtiching means is much less than the number of switching devices in said others of said switching means.

10. The circuit of claim 9, wherein said switching devices are field effect transistors.

11. The improvement of claim 10, wherein said circuit is a logic circuit and in which said signals transferred by said switching means are data signals.

12. The improvement of claim 1, wherein said circuit is integrated on a chip of semiconductor material and wherein said clock generating means comprises a clock generating circuit integrated on the same chip of semiconductor material and receiving an externally generated clock input.

13. The improvement of claim 12, wherein said circuit is a logic circuit and in which said signals transferred by said switching means are data signals.

14. The logic circuit of claim 13, wherein each of said switching means comprises a stage of said circuit, said circuit receiving data signals generated externally of said chip of semiconductor material and transferring same through said clocked switching devices from stage to stage, said at least one switching means including the input stage of the circuit receiving said externally generated data signals.

15. The logic circuit of claim 14, wherein said data signals are transferred by said circuit to an output terminal for use externally of said chip of semiconductor material and wherein said at least one switching means includes an output stage operatively connected to said output terminal.

16. The circuit of claim 14, wherein said plurality of switching means comprise semiconductor switching devices each having a control terminal and an output circuit, said output circuit rendered conductive in response to signals applied to said control terminal thereby to transfer signals through said output circuit, at least one of said switching devices in each of said switching means clocked.

17. The circuit of claim 16, wherein said switching devices are field effect transistors.

18. The logic circuit of claim 13, further comprising a second semiconductor logic circuit integrated on a different chip of semiconductor material, and means operatively connecting said second semiconductor logic circuit to said input stage of said first mentioned semiconductor logic circuit and effective to transfer data signals generated by said second semiconductor logic circuit across the interface between said semiconductor chips to said input stage of said first mentioned semiconductor logic circuit, and wherein said interface transfer means comprises said at least one of said switching means.

19. The improvement of claim 18, wherein said first mentioned semiconductor logic circuit is an MOS logic circuit.

20. The improvement of claim 19, wherein said second semiconductor logic circuit is a TTL circuit.

21. The improvement of claim 1, wherein each set of clock signals comprises a pair of nonoverlapping clock signals.

22. The improvement of claim 1, wherein said clock generating means comprises a clock input signal, first circuit means receiving said clock input signal and effective to generate said one set of clock signals and second circuit means operatively connected to said first circuit means and effective to generate said other set of clock signals.

23. The improvement of claim 22, wherein each set of clock signals comprises a plurality of phased clock signals, and wherein said first circuit means comprises a first subcircuit receiving said clock input signal and effective to generate one of said clock signals of said first set, each of said other clock signals of said first set being generated by a supplementary subcircuit operatively connected to said first subcircuit, said clock signals of said second set each being generated by additional subcircuits operatively connected to said first subcircuit and said supplementary subcircuits, respectively, of said first circuit means.

24. A clock generator circuit for generating first and second sets of clock signals from a clock input signal, each set comprising a plurality of substantially out-of-phase signals and the corresponding signal of each set respectively being substantially like-phased, said circuit comprising a plurality of first sub-circuits each having an input port and an output port and comprising at least two inverter stages, one of said first subcircuits receiving said clock input signal at its input port, the others of said first subcircuits having their input ports connected to the output of the first inverter stage of said one of said first subcircuits, and a plurality of second subcircuits each having an input port and an output port, the input ports of said second subcircuits being operatively connected to the outputs of the second inverter stages of said first subcircuits, respectively.

* * * * *